(12) United States Patent  
Iwamoto

(10) Patent No.: US 11,196,421 B2
(45) Date of Patent: Dec. 7, 2021

(54) LOGIC CIRCUIT AND CIRCUIT CHIP

(71) Applicant: FUJI ELECTRIC CO., LTD., Kanagawa (JP)

(72) Inventor: Motomitsu Iwamoto, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 17/033,907

(22) Filed: Sep. 27, 2020

(65) Prior Publication Data

US 2021/0152178 A1 May 20, 2021

(30) Foreign Application Priority Data

Nov. 15, 2019 (JP) .............................. JP2019-206820

(51) Int. Cl.
*H03K 19/096* (2006.01)
*H03K 19/0944* (2006.01)

(52) U.S. Cl.
CPC ................ *H03K 19/0944* (2013.01)

(58) Field of Classification Search
CPC .................................................. H03K 19/0944
See application file for complete search history.

(56) References Cited

U.S. PATENT DOCUMENTS

| | | | | |
|---|---|---|---|---|
| 5,796,282 A * | 8/1998 | Sprague | ............. | H03K 19/0963 326/98 |
| 5,986,598 A * | 11/1999 | Mittel | ................... | H03M 3/44 341/143 |
| 6,188,246 B1 * | 2/2001 | Ogawa | ............... | H03K 19/0016 326/34 |
| 6,292,029 B1 * | 9/2001 | Kumar | ............. | H03K 19/00338 326/83 |
| 6,344,816 B1 * | 2/2002 | Dedic | ................. | H03M 1/0678 341/144 |
| 6,424,195 B2 * | 7/2002 | Samala | ................. | G11C 11/412 327/200 |
| 6,737,888 B1 * | 5/2004 | Lattimore | .......... | H03K 19/0963 326/121 |
| 6,900,658 B1 * | 5/2005 | Sobelman | ............... | G06F 7/502 326/121 |
| 7,205,810 B1 * | 4/2007 | Lee | .......................... | H03K 5/13 327/231 |

(Continued)

FOREIGN PATENT DOCUMENTS

JP H10276076 A 10/1998
JP 2014030043 A 2/2014

*Primary Examiner* — Kurtis R Bahr

(57) ABSTRACT

Provided is a logic circuit comprising: a switch portion that includes one or more switching devices configured to be turned on and off in accordance with an input signal and is configured to generate an output signal with a logical value according to an operating state of the switching devices; and a clamp portion configured to clamp a voltage of the output signal, of a case where the logical value of the output signal is logic H. The switch portion may be arranged between an output line and a reference potential line, and the clamp portion may be arranged in parallel with the switch portion, between the output line and the reference potential line. The logic circuit may include a current suppression portion configured to suppress a current flowing through the clamp portion, when the logical value of the output signal is logic H.

17 Claims, 11 Drawing Sheets

(56) References Cited

U.S. PATENT DOCUMENTS

| | | | |
|---|---|---|---|
| 7,479,807 B1* | 1/2009 | Cheng | H03K 19/00384 326/121 |
| 9,203,406 B2* | 12/2015 | Singh | H03K 19/0027 |
| 9,407,265 B2* | 8/2016 | Srinath | H03K 19/0963 |
| 10,523,205 B1* | 12/2019 | Tsai | H03K 19/018521 |
| 2001/0039635 A1* | 11/2001 | Chrudimsky | H03K 19/096 714/726 |
| 2002/0163456 A1* | 11/2002 | Dedic | H03M 1/0836 341/144 |
| 2011/0210775 A1* | 9/2011 | Malik | H03K 3/356191 327/200 |
| 2013/0214813 A1* | 8/2013 | Singh | H03K 19/23 326/36 |

* cited by examiner

LOGIC CIRCUIT AND CIRCUIT CHIP

The contents of the following Japanese patent application are incorporated herein by reference:
NO. 2019-206820 filed in JP on Nov. 15, 2019.

BACKGROUND

1. Technical Field

The present invention relates to a logic circuit and a circuit chip.

2. Related Art

A conventional logic circuit includes the one operating at a drive voltage lower than a power source voltage externally applied (see Patent Document 1, for example). When a logic circuit operates in this way, a power source circuit generating a drive voltage from a power source voltage may be provided in the same chip as a chip in which the logic circuit is provided (see Patent Document 1, for example).

Patent Document 1: Japanese Patent Application Publication No. 2014-30043

SUMMARY

Technical Problem

Providing a logic circuit and a power source circuit in the same chip causes an increase in a chip area.

Technical Solution

A first aspect of the present invention provides a logic circuit in order to solve the above-described issue. The logic circuit may have a switch portion that includes one or more switching devices configured to be turned on and off in accordance with an input signal and that is configured to generate an output signal with a logical value according to an operating state of the switching devices. The logic circuit may include a clamp portion configured to clamp a voltage of the output signal, of a case where the logical value of the output signal is logic H.

The logic circuit may include an output line configured to output the output signal, and a reference potential line to which a predetermined reference potential is applied. The switch portion may be arranged between the output line and the reference potential line. The clamp portion may be arranged in parallel with the switch portion, between the output line and the reference potential line.

The logic circuit may include a current suppression portion configured to suppress a current flowing through the clamp portion, when the logical value of the output signal is logic H.

The logic circuit may include a high potential line to which a potential higher than the reference potential is applied. The current suppression portion may be arranged between the high potential line and the clamp portion.

The current suppression portion may be a current source.

The clamp portion may include a diode-connected MOS transistor that is arranged between the output line and the reference potential line. The current suppression portion may include a MOS transistor that is arranged between the high potential line and the clamp portion.

The MOS transistor of the current suppression portion may have a breakdown voltage higher than that of the MOS transistor of the clamp portion. The voltage of the output signal may be based on the reference potential, and the clamp portion may be configured to clamp the voltage of the output signal of a case where the logical value of the output signal is logic H, to a voltage lower than a voltage between the reference potential and the potential of the high potential line. The clamp portion may be configured to clamp the voltage of the output signal of a case where the logical value of the output signal is logic H, to a voltage lower than a voltage between a potential of said output signal and the potential of the high potential line.

The switch portion may include a first MOS transistor that is arranged between the output line and the reference potential line and has a gate terminal to which a first input signal is applied. The clamp portion may be configured to clamp a voltage in the output line, of a case where the first MOS transistor is turned off.

The switch portion may include a second MOS transistor that is arranged between the output line and the reference potential line and has a gate terminal to which a second input signal is applied. The switch portion may include a third MOS transistor that is arranged between the second MOS transistor and the reference potential line, is connected in series with the second MOS transistor, and has a gate terminal to which a third input signal is applied. The clamp portion may be configured to clamp a voltage in the output line, of a case where at least one of the second MOS transistor and the third MOS transistor is turned off.

The switch portion may include a fourth MOS transistor that is arranged between the output line and the reference potential line and has a gate terminal to which a fourth input signal is applied. The switch portion may include a fifth MOS transistor that is arranged between the output line and the reference potential line, is connected in parallel with the fourth MOS transistor, and has a gate line to which a fifth input signal is applied. The clamp portion may be configured to clamp a voltage in the output line, of a case where both the fourth MOS transistor and the fifth MOS transistor are turned off.

The clamp portion may include a Zener diode having a cathode arranged on the side of the output line, and a forward diode having a cathode arranged on the side of the reference potential line.

The logic circuit may include a plurality of the output lines, where the clamp portion may be provided on each of the output lines.

A second aspect of the present invention provides a circuit chip that includes: the logic circuit according to the first aspect; and an analog circuit.

The logic circuit may be configured to control a transistor of the analog circuit.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through the embodiments of the invention, but the following embodiments do not limit the claimed invention. Moreover, not all the combinations of features described in the embodiments are essential to solutions of the invention.

Figure 1:
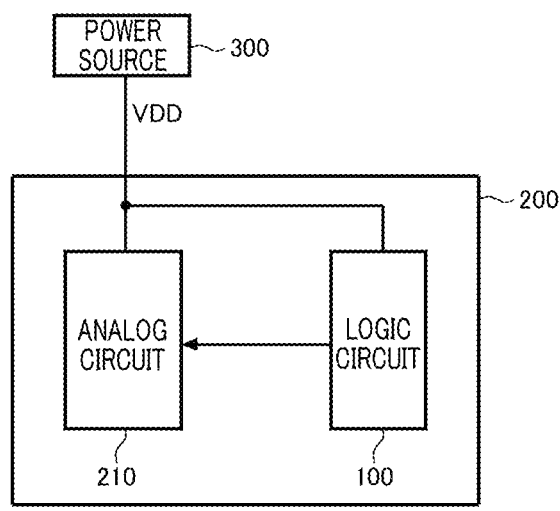
FIG. 1 is a block diagram showing an example of a circuit chip 200 according to one embodiment of the present invention.

FIG. 1 is a block diagram showing an example of a circuit chip 200 according to one embodiment of the present invention. The circuit chip 200 incorporates a logic circuit 100. The circuit chip 200 may also further incorporate a circuit other than the logic circuit 100. In the example of FIG. 1, the circuit chip 200 incorporates the logic circuit 100 and an analog circuit 210.

The logic circuit 100 includes a switching device such as a MOS transistor. The logic circuit 100 may include at least one of an inverter circuit, a NAND circuit, and a NOR circuit. The inverter circuit, the NAND circuit, and the NOR circuit can be combined to realize a logic circuit that outputs an arbitrary logical value for an input logical value.

A power source voltage VDD is applied to the circuit chip 200 from an external power source 300. A power source voltage VDD is applied to the analog circuit 210 and the logic circuit 100 from the power source 300. The power source voltage VDD is a voltage higher than an operating voltage of the logic circuit 100. The operating voltage of the logic circuit 100 may refer to the maximum voltage of voltages applied to the switching device included in the logic circuit 100, or may refer to the maximum voltage of voltages output by the logic circuit 100. Moreover, when the logic circuit 100 includes a MOS transistor, the power source voltage VDD may be a voltage higher than a breakdown voltage of a gate oxide film of the MOS transistor.

The analog circuit 210 is a circuit including an analog device. The analog circuit 210 may include a power device such as an insulated gate bipolar transistor or a power MOSFET, that supply power to the outside. The analog circuit 210 may be formed in the same semiconductor substrate as a semiconductor substrate in which the logic circuit 100 is formed.

The logic circuit 100 may control the analog circuit 210. The logic circuit 100 may generate a signal applied to a gate of the power MOSFET included in the analog circuit 210. As a more specific example, the logic circuit 100 may control whether to cause the analog circuit 210 to output power, based on a result of a detection of an overcurrent or the like by a sensor. The circuit chip 200 may be an in-vehicle chip mounted on a vehicle such as an automobile. It should be noted that the application of the circuit chip 200 is not limited thereto.

The circuit chip 200 does not include a power source circuit that generates from the power source voltage VDD an operating voltage applied to the logic circuit 100. The logic circuit 100 in the present example clamps its output voltage to suppress a voltage applied to the switching device. This allows the power source voltage VDD to be applied to the logic circuit 100 to drive the logic circuit 100, without arranging a power source circuit between the power source 300 and the logic circuit 100, for example. As such, the circuit chip 200 can be downscaled.

Figure 2:
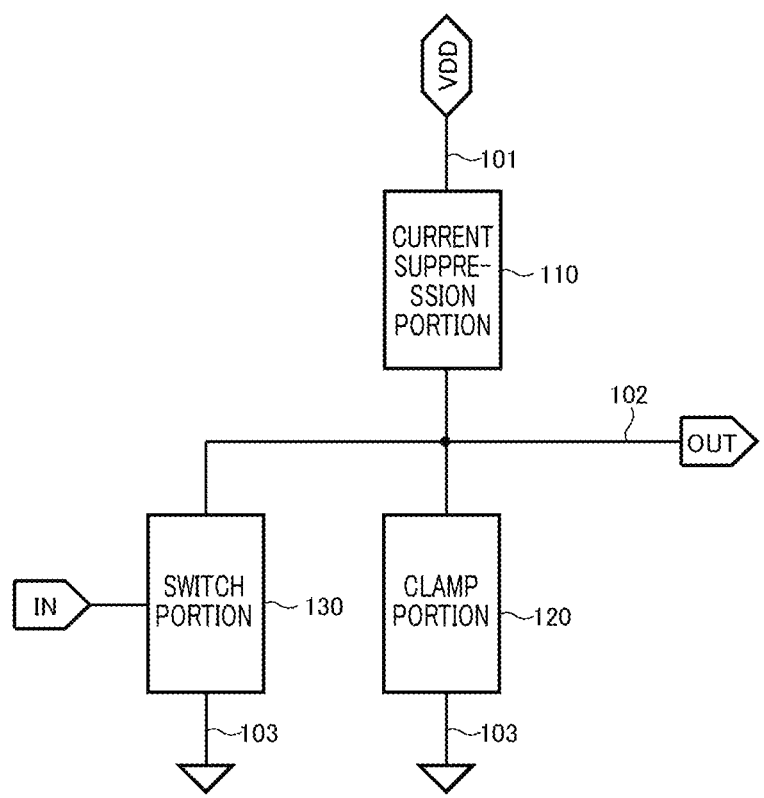
FIG. 2 is a block diagram showing an exemplary configuration of a logic circuit 100.

FIG. 2 is a block diagram showing an exemplary configuration of the logic circuit 100. The logic circuit 100 in the present example includes a switch portion 130 and a clamp portion 120. The logic circuit 100 may also further include a high potential line 101, an output line 102, a reference potential line 103, and a current suppression portion 110.

A predetermined reference potential is applied to the reference potential line 103. The reference potential in the present example is a ground potential. A potential higher than the reference potential is applied to the high potential line 101. A power source voltage VDD is applied to the high potential line 101 in the present example. The high potential line 101 may be connected to the external power source 300 shown in FIG. 1. The power source voltage VDD is 10V or more, for example. The output line 102 outputs an output signal OUT of the logic circuit 100.

The switch portion 130 includes one or more switching devices configured to be turned on and off in accordance with an input signal IN, and is configured to generate an output signal OUT with a logical value according to an operating state of the switching devices. The switch portion 130 in the present example is arranged between the output line 102 and the reference potential line 103. The switch portion 130 generates a logical value of the output signal OUT in accordance with a logical value of the input signal IN. The switch portion 130 in the present example selects the reference potential line 103 when the logical value of the output signal OUT is logic L, selects the high potential line 101 when the logical value of the output signal OUT is logic H, and outputs a voltage according to the selected potential line.

The clamp portion 120 clamps a voltage of the output signal OUT, of a case where the logical value of the output signal OUT is logic H, to a voltage lower than the power source voltage VDD. The voltage of the output signal OUT is a voltage based on the reference potential. The clamp portion 120 may be configured to clamp a voltage of the output signal of a case where the logical value of the output signal OUT is logic H, to a voltage lower than a voltage between the reference potential and the potential of the high potential line. The voltage between the reference potential and the potential of the high potential line may be a potential obtained by subtracting the reference potential from the potential of the high potential line, or may be an intermediate potential between the potential of the high potential line and the reference potential. The clamp portion 120 may also be configured to clamp the voltage of the output signal OUT of a case where the logical value of the output signal OUT is logic H, to a voltage lower than a voltage between the potential of the output signal OUT and the potential of the high potential line. The voltage between the potential of the output signal OUT and the potential of the high potential line may be a potential obtained by subtracting the potential of the output signal OUT from the potential of the high potential line, or may be an intermediate potential between the potential of the high potential line and the potential of the output signal OUT. The logic H voltage of the output signal OUT clamped by the clamp portion 120 may be less than or equal to one half of the power source voltage VDD. The clamp portion 120 in the present example is provided in parallel with the switch portion 130, between the output line 102 and the reference potential line 103.

Providing the clamp portion 120 allows a potential of the output line 102 to be suppressed to a potential lower than the power source voltage VDD, even when the switch portion 130 selects the high potential line 101. As such, the logic circuit 100 can be driven with the power source voltage VDD without using the power source circuit.

Another method for driving the logic circuit with the power source voltage VDD includes thickening the gate oxide film of the MOS transistor included in the logic circuit. However, with a circuit other than the logic circuit 100 (the analog circuit 210, for example) being provided in the same semiconductor substrate, the gate oxide film of said circuit will be also thickened and the characteristics of said circuit will be changed. According to the logic circuit 100, the logic circuit 100 can be driven with the power source voltage VDD even without thickening the gate oxide film.

When the logical value of the output signal OUT is logic H, the clamp portion 120 electrically connects the output line 102 and the reference potential line 103 via a device such as a diode. The current suppression portion 110 is configured to suppress a current flowing through the clamp portion 120, when the logical value of the output signal OUT is logic H. This allows the power consumption of the logic circuit 100 to be reduced. The current suppression portion 110 in the present example is provided between the high potential line 101 and the clamp portion 120 (or the output line 102), and is configured to suppress a current flowing from the high potential line 101 to the clamp portion 120.

Moreover, a through-current may flow through the switch portion 130. For example, when a plurality of MOS transistors provided in series between the output line 102 and the reference potential line 103 are simultaneously turned on at a timing when the logical value of the input signal IN is transited, a large through-current flows through the switch portion 130. Providing the current suppression portion 110 allows the through-current in the switch portion 130 to be also suppressed. This allows the power consumption of the logic circuit 100 to be reduced.

Figure 3:
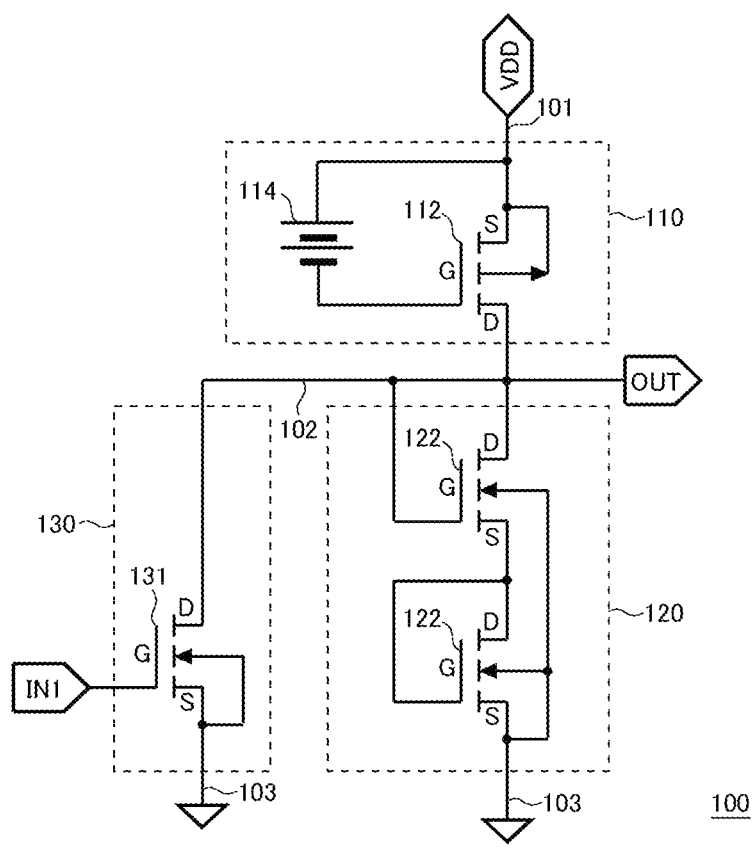
FIG. 3 is a circuit diagram showing an exemplary configuration of a switch portion 130, a clamp portion 120, and a current suppression portion 110.

FIG. 3 is a circuit diagram showing an exemplary configuration of the switch portion 130, the clamp portion 120, and the current suppression portion 110. The switch portion 130 in the present example is an inverter circuit. The switch portion 130 includes a first MOS transistor 131. The first MOS transistor 131 is arranged between the output line 102 and the reference potential line 103, where a first input signal IN1 is applied to a gate terminal G. The first MOS transistor 131 in the present example is a N-channel MOS transistor, where a drain terminal D is connected to the output line 102, and a source terminal S is connected to the reference potential line 103. The first MOS transistor 131 selects the reference potential line 103 when being turned on, selects the high potential line 101 when being turned off, and outputs a potential according to the selected potential line as the voltage of the output signal OUT.

The clamp portion 120 is configured to clamp a voltage in the output line 102, of a case where the first MOS transistor 131 is turned off. The clamp portion 120 in the present example includes one or more diodes. Each diode may also be a MOS transistor having a gate terminal and a drain terminal connected to each other, that is, a diode-connected MOS transistor. A clamp MOS transistor 122 in the present example is a diode-connected N-channel MOS transistor. The clamp portion 120 in the present example includes a plurality of clamp MOS transistors 122 connected in series between the output line 102 and the reference potential line 103. A clamp voltage in the clamp portion 120 can be adjusted according to the number of the clamp MOS transistors 122 connected in series. It should be noted that a substrate of each clamp MOS transistor 122 may be connected to the reference potential.

The current suppression portion 110 in the present example is a current source that defines the amount of a current flowing from the high potential line 101 to the output line 102. The current suppression portion 110 in the present example includes a suppression MOS transistor 112 and a power source 114. The suppression MOS transistor 112 in the present example is a P-channel MOS transistor having a source terminal S connected to the high potential line 101 and a drain terminal connected to the output line 102. The power source 114 keeps a source-gate voltage of the suppression MOS transistor 112 at a constant value. This allows the current flowing from the high potential line 101 to the output line 102 to be controlled to be a constant current according to a voltage of the power source 114. The power source 114 may also be provided outside the circuit chip 200. The power source 114 may also be omitted. In this case, the source terminal S and a gate terminal G of the suppression MOS transistor 112 may be connected to each other.

Moreover, the current suppression portion 110 may also be a resistor provided between the high potential line 101 and the output line 102. Such a configuration also allows the current flowing from the high potential line 101 to the output line 102 to be suppressed. It should be noted that since the area of a MOS transistor or the like is smaller than that of a resistor device on a semiconductor substrate, the circuit scale can be reduced, with the current suppression portion 110 having the configuration shown in FIG. 3. Moreover, the current flowing from the high potential line 101 to the output line 102 can be accurately controlled, with the current suppression portion 110 having the configuration shown in FIG. 3. The current suppression portion 110 may also have the configuration of the current source shown in FIG. 3 and said resistor.

Figure 4:
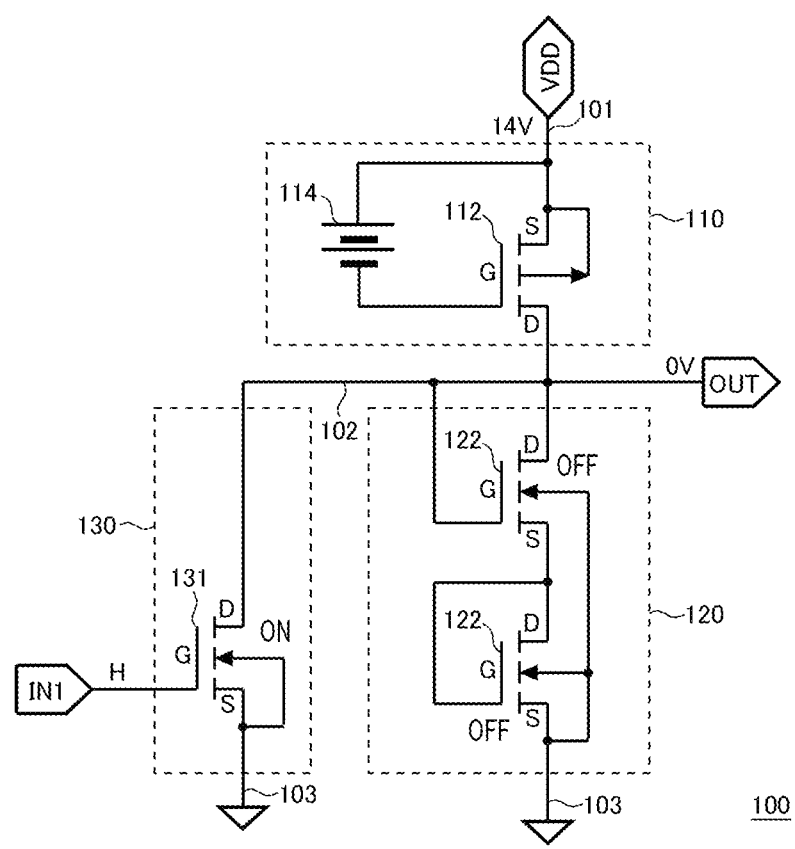
FIG. 4 is a diagram showing an exemplary operation of the logic circuit 100 shown in FIG. 3.

FIG. 4 is a diagram showing an exemplary operation of the logic circuit 100 shown in FIG. 3. In FIG. 4, a logical value of the first input signal IN1 is logic H. Moreover, the power source voltage VDD is 14V, and the reference potential is 0V.

In this case, the first MOS transistor 131 of the switch portion 130 is turned on, and the potential of the output line 102 becomes 0V. Moreover, the plurality of clamp MOS transistors 122 of the clamp portion 120 are turned off. A current limited by the current suppression portion 110 flows from the high potential line 101 to the switch portion 130.

Figure 5:
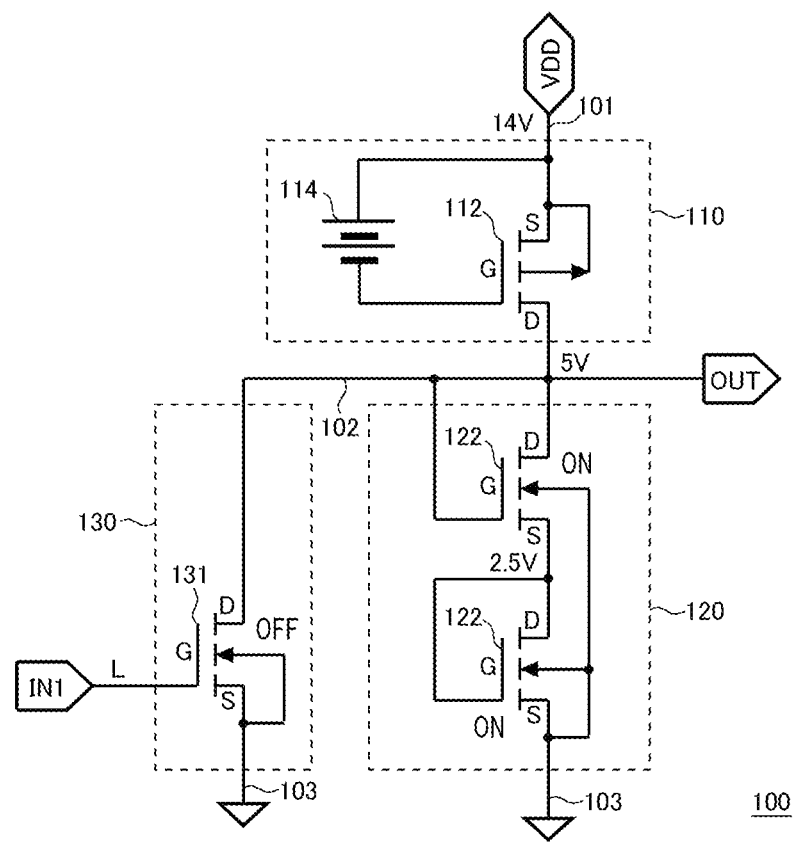
FIG. 5 is a diagram showing an exemplary operation of the logic circuit 100 shown in FIG. 3.

FIG. 5 is a diagram showing an exemplary operation of the logic circuit 100 shown in FIG. 3. In FIG. 5, a logical value of the first input signal IN1 is logic L. In this case, the first MOS transistor 131 of the switch portion 130 is turned off, and a voltage according to the power source voltage VDD is applied to the output line 102. It should be noted that the voltage of the output line 102 is clamped to a predetermined clamp voltage (5V in the present example) by the clamp portion 120.

A current limited by the current suppression portion 110 flows from the high potential line 101 to the clamp portion

120. Since the clamp MOS transistors 122 are diode-connected, a source-drain voltage of each clamp MOS transistor 122 is a voltage obtained by adding an overdrive voltage Vov to a threshold voltage Vth of the clamp MOS transistor 122. The overdrive voltage Vov is a voltage obtained by subtracting the threshold voltage Vth from a gate-source voltage Vgs.

For example, when the threshold voltage Vth is 1V and the overdrive voltage Vov is 1.5V, a clamp voltage of 5V can be obtained by connecting the two clamp MOS transistors 122 in series. Thus, providing the clamp portion 120 allows the voltage of the output signal OUT to be controlled to be a predetermined voltage regardless of the magnitude of the power source voltage VDD.

It should be noted that the suppression MOS transistor 112 preferably has a breakdown voltage higher than that of the clamp MOS transistor 122. When the clamp voltage in the clamp portion 120 is lower than half of the power source voltage VDD, a higher voltage is applied between the source and the drain of the suppression MOS transistor 112, than between the source and the drain of the clamp MOS transistor 122. As such, a source-drain breakdown voltage of the suppression MOS transistor is preferably higher than a source-drain breakdown voltage of the clamp MOS transistor 122. Said breakdown voltage refers to a source-drain voltage that causes electrical connection between the source and the drain, when the gate is turned off. A breakdown voltage of the MOS transistor can be adjusted with a distance between a source region and a drain region, an impurity concentration of each region, or the like.

Figure 6:
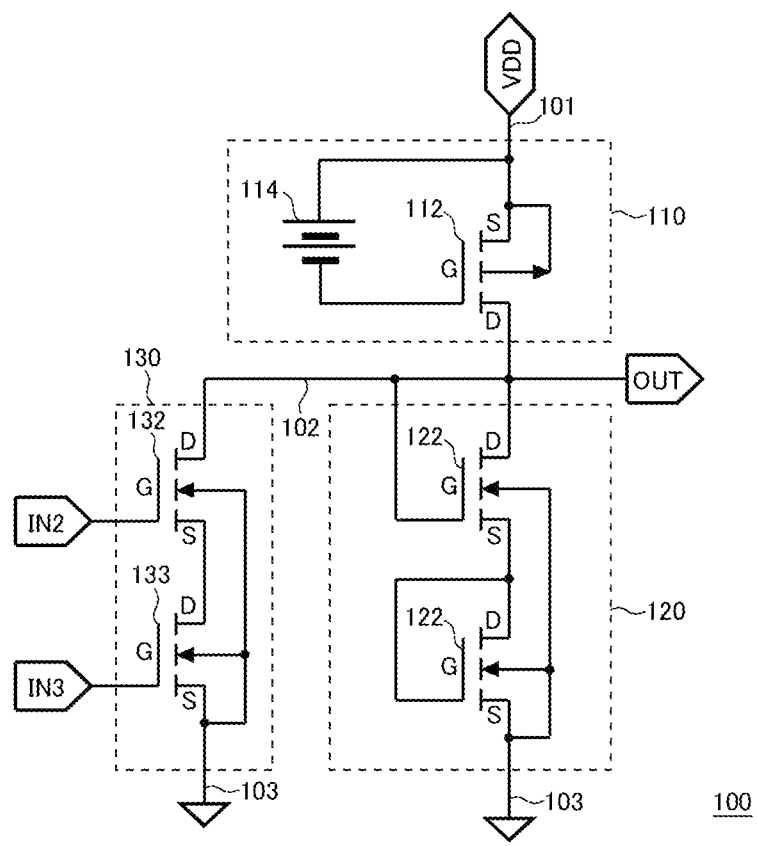
FIG. 6 is a diagram showing another example of the switch portion 130.

FIG. 6 is a diagram showing another example of the switch portion 130. The switch portion 130 in the present example is a NAND circuit. Except for the switch portion 130, the configuration shown in the present example is the same as the configuration shown in FIG. 3. The switch portion 130 in the present example includes a second MOS transistor 132 and a third MOS transistor 133.

The second MOS transistor 132 is arranged between the output line 102 and the reference potential line 103, where a second input signal IN2 is applied to a gate terminal G. The third MOS transistor 133 is arranged between the second MOS transistor 132 and the reference potential line 103, and is connected in series with the second MOS transistor 132, where a third input signal IN3 is applied to a gate terminal G. The second MOS transistor 132 and the third MOS transistor 133 in the present example are N-channel MOS transistors. In the present example, a drain terminal D of the second MOS transistor 132 is connected to the output line 102. A source terminal S of the second MOS transistor 132 is connected to a drain terminal D of the third MOS transistor 133. A source terminal S of the third MOS transistor 133 is connected to the reference potential line 103.

In the present example, when both the second MOS transistor 132 and the third MOS transistor 133 are turned on, the potential of the output line 102 is the reference potential. Moreover, when at least one of the second MOS transistor 132 and the third MOS transistor 133 is turned off, the switch portion 130 selects the high potential line 101. The clamp portion 120 is configured to clamp a voltage in the output line 102, of a case where at least one of the second MOS transistor 132 and the third MOS transistor 133 is turned off.

Figure 7:
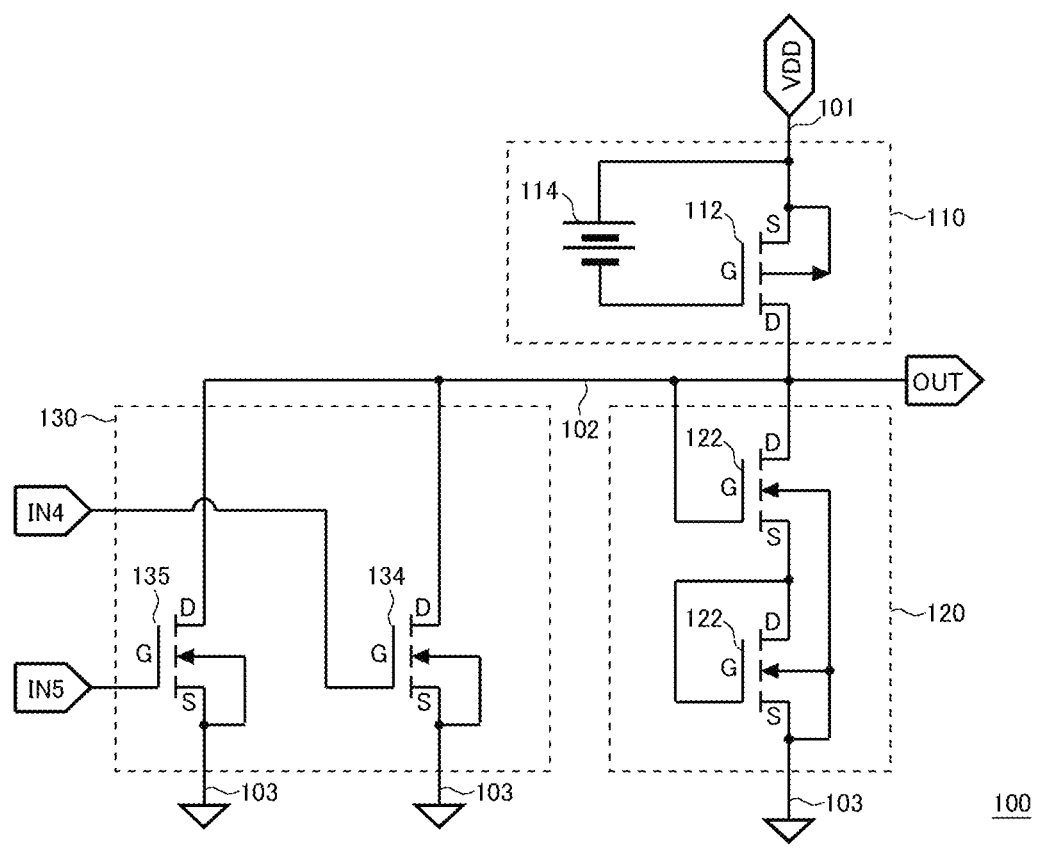
FIG. 7 is a diagram showing another example of the switch portion 130.

FIG. 7 is a diagram showing another example of the switch portion 130. The switch portion 130 in the present example is a NOR circuit. Except for the switch portion 130, the configuration shown in the present example is the same as the configuration shown in FIG. 3. The switch portion 130 in the present example includes a fourth MOS transistor 134 and a fifth MOS transistor 135.

The fourth MOS transistor 134 is arranged between the output line 102 and the reference potential line 103, where a fourth input signal IN4 is applied to a gate terminal G. The fifth MOS transistor 135 is arranged between the output line 102 and the reference potential line 103, where a fifth input signal IN5 is applied to a gate terminal G. The fourth MOS transistor 134 and the fifth MOS transistor 135 are arranged in parallel with each other, between the output line 102 and the reference potential line 103. The fourth MOS transistor 134 and the fifth MOS transistor 135 in the present example are N-channel MOS transistors. In the present example, drain terminals D of the fourth MOS transistor 134 and the fifth MOS transistor 135 are connected to the output line 102. Source terminals S of the fourth MOS transistor 134 and the fifth MOS transistor 135 are connected to the reference potential line 103.

In the present example, when at least one of the fourth MOS transistor 134 and the fifth MOS transistor 135 is turned on, the potential of the output line 102 is the reference potential. Moreover, when both the fourth MOS transistor 134 and the fifth MOS transistor 135 are turned off, the potential of the output line 102 is a potential according to the power source voltage VDD. The clamp portion 120 is configured to clamp a voltage in the output line 102, of a case where both the fourth MOS transistor 134 and the fifth MOS transistor 135 are turned off. It should be noted that the logic circuit 100 may be a circuit obtained by appropriately combining the inverter circuit shown in FIG. 3, the NAND circuit shown in FIG. 6, and the NOR circuit shown in FIG. 7.

Figure 8:
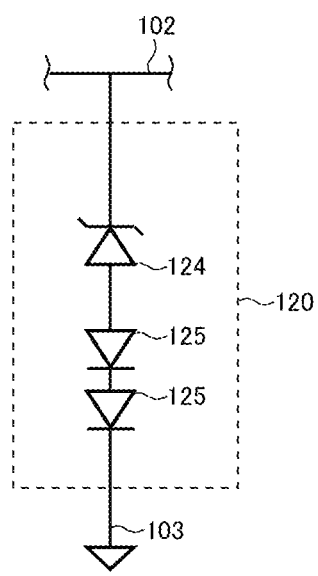
FIG. 8 is a diagram showing another exemplary configuration of the clamp portion 120.

FIG. 8 is a diagram showing another exemplary configuration of the clamp portion 120. The clamp portion 120 in the present example includes a Zener diode 124 and a forward diode 125. A cathode of the Zener diode 124 is arranged on the side of the output line 102. A cathode of the forward diode 125 is arranged on the side of the reference potential line 103. In the present example, the cathode of the Zener diode 124 is connected to the output line 102, and an anode thereof is connected to an anode of the forward diode 125. The cathode of the forward diode 125 is connected to the reference potential line 103. The clamp portion 120 may include a plurality of Zener diodes 124. The clamp portion 120 may include a plurality of forward diodes 125.

A voltage drop between the output line 102 and the reference potential line 103 due to the Zener diode 124 may be larger than said voltage drop due to the forward diode 125. According to the present example, the clamp voltage can be roughly adjusted by using the voltage drop due to the Zener diode 124, and the clamp voltage can be precisely adjusted by using the voltage drop due to the forward diode 125.

Figure 9:
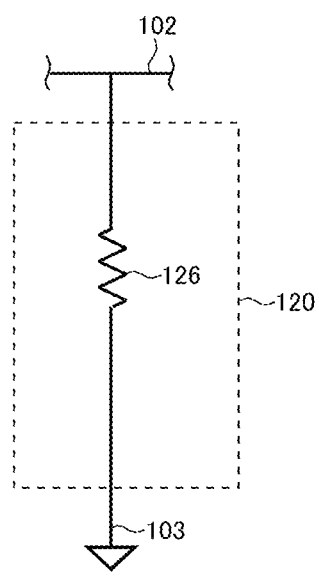
FIG. 9 is a diagram showing another exemplary configuration of the clamp portion 120.

FIG. 9 is a diagram showing another exemplary configuration of the clamp portion 120. The clamp portion 120 in the present example includes a resistor 126 arranged between the output line 102 and the reference potential line 103. In the present example, the current suppression portion 110 is a current source as shown in FIG. 3. When the output signal OUT is logic H, a current defined by the current suppression portion 110 flows through the clamp portion 120. As such, the potential of the output line 102 is determined by said current and a resistance value of the resistor 126. Such a configuration also allows the potential of the output line 102 to be clamped. The resistance value of the resistor 126 may be 10 times or more, may be 100 times or more, or may be 1000 times or more, of an ON-resistance of the suppression MOS transistor 112.

The clamp portion 120 may have a configuration in which the Zener diode 124, the forward diode 125, and the resistor 126 are combined. The clamp portion 120 may include the Zener diode 124 and the resistor 126, may include the plurality of forward diodes 125 and the resistor 126, or may include the Zener diode 124, the forward diode 125, and the resistor 126.

Figure 10:
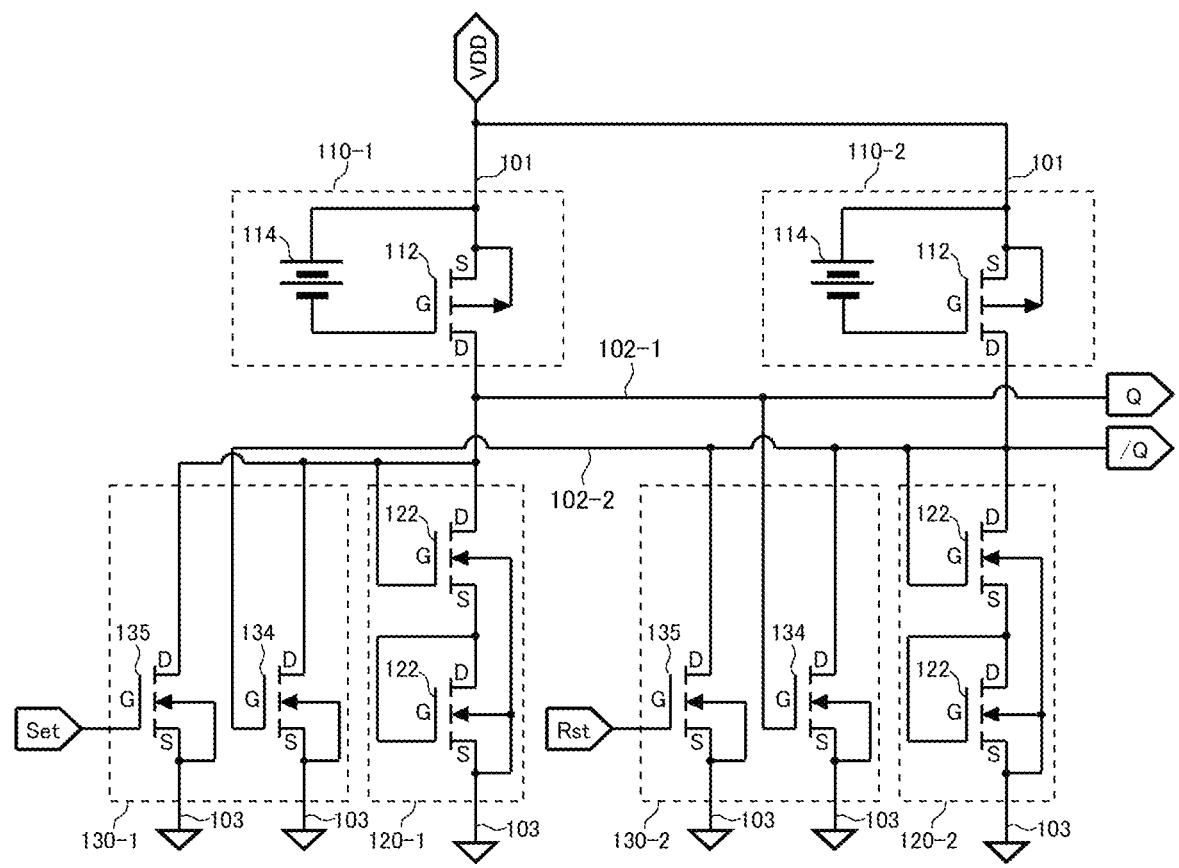
FIG. 10 is a diagram showing another exemplary configuration of the logic circuit 100.

FIG. 10 is a diagram showing another exemplary configuration of the logic circuit 100. The logic circuit 100 in the present example includes a plurality of the output lines 102. The logic circuit 100 shown in FIG. 10 includes an output line 102-1 and an output line 102-2. In the present example, the clamp portion 120 is provided for each output line 102. In the logic circuit 100 shown in FIG. 10, a clamp portion 120-1 is provided between the output line 102-1 and the reference potential line 103, and a clamp portion 120-2 is provided between the output line 102-2 and the reference potential line 103.

The switch portion 130 may be provided between each output line 102 and the reference potential line 103. In the logic circuit 100 shown in FIG. 10, a switch portion 130-1 is provided between the output line 102-1 and the reference potential line 103, and a switch portion 130-2 is provided between the output line 102-2 and the reference potential line 103.

The current suppression portion 110 may be provided between each output line 102 and the high potential line 101. In the logic circuit 100 shown in FIG. 10, a current suppression portion 110-1 is provided between the output line 102-1 and the high potential line 101, and a current suppression portion 110-2 is provided between the output line 102-2 and the high potential line 101.

Each clamp portion 120, switch portion 130, and current suppression portion 110 may have any of the configurations described in FIG. 1 to FIG. 9. The logic circuit 100 in the present example includes two of the NOR circuits shown in FIG. 7. The NOR circuits are provided in parallel with each other, between the high potential line 101 and the reference potential line 103. The logic circuit 100 of the present example is a set-reset flip-flop circuit that outputs an output signal Q and an output signal/Q in accordance with a set signal Set and a reset signal Rst.

The set signal Set is input to a gate terminal G of the fifth MOS transistor 135 of the switch portion 130-1 in the present example, and the reset signal Rst is input to a gate terminal G of the fifth MOS transistor 135 of the switch portion 130-2.

A gate terminal G of the fourth MOS transistor 134 of the switch portion 130-1 is connected to the output line 102-2. Moreover, a gate terminal G of the fourth MOS transistor 134 of the switch portion 130-2 is connected to the output line 102-1. Except for this, the structure shown in the present example is similar to that of the logic circuit 100 shown in FIG. 7.

In the present example, when logic H is input as the set signal Set, the output signal Q is transited to logic L, and the output signal/Q is transited to logic H. In this case, the clamp portion 120-2 is configured to clamp a voltage of the output signal/Q. Moreover, when logic H is input as the reset signal Rst, the output signal Q is transited to logic H, and the output signal/Q is transited to logic L. In this case, the clamp portion 120-1 is configured to clamp a voltage of the output signal Q. According to the present example, providing the clamp portion 120 for each output line 102 allows each switch portion 130 to be driven by using the power source voltage VDD.

Figure 11:
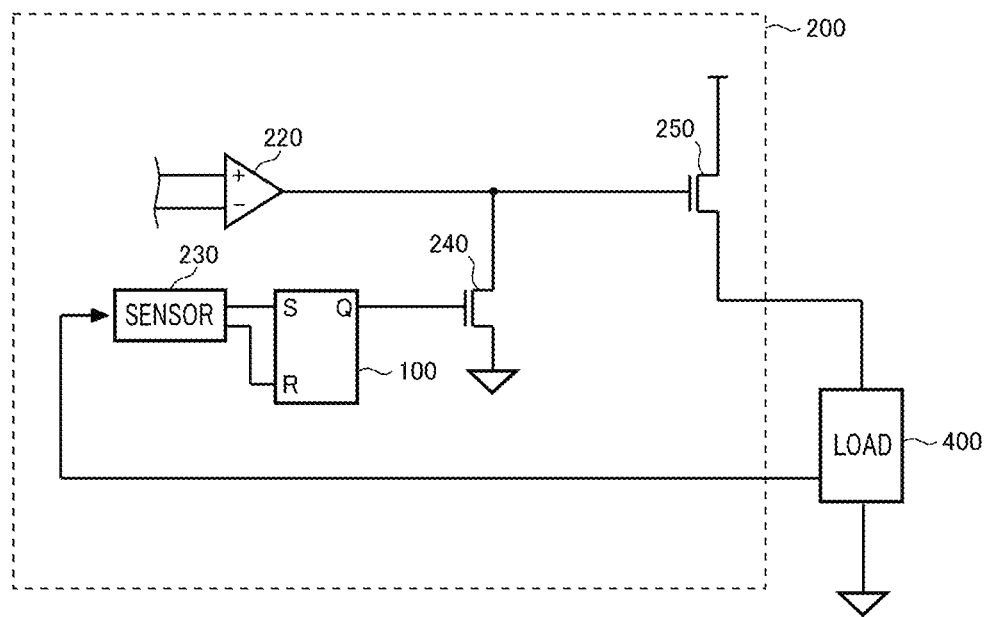
FIG. 11 is a diagram showing an exemplary configuration of the circuit chip 200.

FIG. 11 is a diagram showing an exemplary configuration of the circuit chip 200. The circuit chip 200 in the present example includes the logic circuit 100, an output transistor 250, an extraction transistor 240, a signal output portion 220, and a sensor 230. The output transistor 250, the extraction transistor 240, the signal output portion 220, and the sensor 230 are a part of the analog circuit 210.

The output transistor 250 switches whether to supply power to a load 400. The output transistor 250 is an IGBT or a power MOSFET, for example. The signal output portion 220 controls the output transistor 250. The signal output portion 220 may be an amplifier that inputs an analog signal to a gate terminal of the output transistor 250.

The extraction transistor 240 switches whether to connect the gate terminal of the output transistor 250 to the ground potential. Connecting the gate terminal of the output transistor 250 to the ground potential allows charges to be extracted from the gate terminal to forcibly turn off the output transistor 250.

The sensor 230 monitors the state of the load 400 or the circuit chip 200. For example, the sensor 230 monitors an occurrence of an abnormality such as an overcurrent or overheat in the load 400 or the like. When an abnormality occurs in the load 400 or the like, the sensor 230 notifies the logic circuit 100 thereof. The logic circuit 100 controls the extraction transistor 240 to be turned on, and turns off the output transistor 250, when the sensor 230 detects an occurrence of an abnormality.

The logic circuit 100 may include any of the aspects described in FIG. 1 to FIG. 10. As an example, the logic circuit 100 is the SR flip-flop shown in FIG. 10. The logic circuit 100 keeps the extraction transistor 240 turned on until logic H is input as the reset signal Rst, when the set signal Set becomes logic H (that is, when an abnormality is detected), for example.

In the logic circuit 100 of the present example, the clamp portion 120 is provided for each output line 102. As such, when the number of the output lines 102 is large, the number of the clamp portions 120 will also become large. In the logic circuit 100, the number of the output lines 102 may be five or less, or may be 2 or less. As a result, the circuit chip 200 is more easily downsized by providing the clamp portion 120 than by providing the power source circuit that generates the operating voltage from the power source voltage VDD.

A breakdown voltage of a gate oxide film of the extraction transistor 240 may be lower than the power source voltage VDD. According to the present example, since the output voltage of the logic circuit 100 can be lower than the power source voltage VDD, it is possible to use the extraction transistor 240 having a low breakdown voltage.

As shown in FIG. 1 etc., the logic circuit provided in the same chip as a chip in which the analog circuit 210 is provided, often has a small number of output lines 102. This makes the effect of the logic circuit 100 more remarkable. The number of the output lines 102 is often small, especially when the analog circuit 210 occupies most of the area of the circuit and the logic circuit 100 is incidentally arranged. As a more specific example, as shown in FIG. 11, by using the logic circuit 100 described in FIG. 1 to FIG. 10 as a circuit for controlling a switching device such as a transistor included in the analog circuit 210, the circuit scale is easily reduced.

While the embodiments of the present invention have been described, the technical scope of the present invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the present invention.

What is claimed is:

1. A logic circuit comprising:
    a switch portion that includes one or more switching devices configured to be turned on and off in accordance with an input signal and is configured to generate an output signal with a logical value according to an operating state of the switching devices; and
    a clamp portion configured to clamp a voltage of the output signal, of a case where the logical value of the output signal is logic H;
    an output line configured to output the output signal;
    a reference potential line to which a predetermined reference potential is applied; and
    a high potential line to which a potential higher than the reference potential is applied, wherein
        the switch portion is arranged between the output line and the reference potential line,
        the clamp portion is arranged in parallel with the switch portion, between the output line and the reference potential line,
        the voltage of the output signal is based on the reference potential, and
        the clamp portion is configured to clamp the voltage of the output signal of a case where the logical value of the output signal is logic H, to a voltage lower than a voltage between the reference potential and the potential of the high potential line.

2. The logic circuit according to claim 1, further comprising:
    a current suppression portion configured to suppress a current flowing through the clamp portion, when the logical value of the output signal is logic H.

3. The logic circuit according to claim 2, wherein the current suppression portion is arranged between the high potential line and the clamp portion.

4. The logic circuit according to claim 3, wherein the clamp portion includes a diode-connected MOS transistor that is arranged between the output line and the reference potential line.

5. The logic circuit according to claim 4, wherein the current suppression portion includes a MOS transistor that is arranged between the high potential line and the clamp portion.

6. The logic circuit according to claim 4, wherein the MOS transistor of the current suppression portion has a breakdown voltage higher than that of the MOS transistor of the clamp portion.

7. The logic circuit according to claim 2, wherein the current suppression portion is a current source.

8. The logic circuit according to claim 1, wherein the clamp portion is configured to clamp the voltage of the output signal of a case where the logical value of the output signal is logic H, to a voltage lower than a voltage between a potential of the output signal and the potential of the high potential line.

9. The logic circuit according to claim 1, wherein the switch portion includes a first MOS transistor that is arranged between the output line and the reference potential line and has a gate terminal to which a first input signal is applied, and
    the clamp portion is configured to clamp a voltage in the output line, of a case where the first MOS transistor is turned off.

10. The logic circuit according to claim 1, wherein the switch portion includes:
    a second MOS transistor that is arranged between the output line and the reference potential line and has a gate terminal to which a second input signal is applied; and
    a third MOS transistor that is arranged between the second MOS transistor and the reference potential line, is connected in series with the second MOS transistor, and has a gate terminal to which a third input signal is applied, wherein
        the clamp portion is configured to clamp a voltage in the output line, of a case where at least one of the second MOS transistor and the third MOS transistor is turned off.

11. The logic circuit according to claim 1, wherein the switch portion includes:
    a fourth MOS transistor that is arranged between the output line and the reference potential line and has a gate terminal to which a fourth input signal is applied; and
    a fifth MOS transistor that is arranged between the output line and the reference potential line, is connected in parallel with the fourth MOS transistor, and has a gate line to which a fifth input signal is applied, wherein
        the clamp portion is configured to clamp a voltage in the output line, of a case where both the fourth MOS transistor and the fifth MOS transistor is turned off.

12. The logic circuit according to claim 1, wherein the clamp portion includes:
    a Zener diode having a cathode arranged on the side of the output line; and
    a forward diode having a cathode arranged on the side of the reference potential line.

13. The logic circuit according to claim 1, comprising:
    a plurality of the output lines, wherein the clamp portion is provided on each of the output lines.

14. A circuit chip comprising:
    the logic circuit according to claim 1; and an analog circuit.

15. The circuit chip according to claim 14, wherein the logic circuit is configured to control a transistor of the analog circuit.

16. A logic circuit comprising:
    a switch portion that includes one or more switching devices configured to be turned on and off in accordance with an input signal and is configured to generate an output signal with a logical value according to an operating state of the switching devices;
    a clamp portion configured to clamp a voltage of the output signal, of a case where the logical value of the output signal is logic H;
    an output line configured to output the output signal; and
    a reference potential line to which a predetermined reference potential is applied, wherein the clamp portion includes a diode-connected MOS transistor that is arranged between the output line and the reference potential line.

17. A logic circuit comprising:
    a switch portion that includes one or more switching devices configured to be turned on and off in accordance with an input signal and is configured to generate an output signal with a logical value according to an operating state of the switching devices;

a clamp portion configured to clamp a voltage of the output signal, of a case where the logical value of the output signal is logic H;

an output line configured to output the output signal; and a reference potential line to which a predetermined reference potential is applied, wherein the switch portion is arranged between the output line and the reference potential line, the clamp portion is arranged in parallel with the switch portion, between the output line and the reference potential line, the switch portion includes a first MOS transistor that is arranged between the output line and the reference potential line and has a gate terminal to which a first input signal is applied, and the clamp portion is configured to clamp a voltage in the output line, of a case where the first MOS transistor is turned off.

\* \* \* \* \*